United States Patent
Bergendahl et al.

(10) Patent No.: US 11,557,589 B2
(45) Date of Patent: Jan. 17, 2023

(54) AIR GAP SPACER FOR METAL GATES

(71) Applicant: TESSERA LLC, San Jose, CA (US)

(72) Inventors: Marc A. Bergendahl, Troy, NY (US); Kangguo Cheng, Schenectady, NY (US); Fee Li Lie, Albany, NY (US); Eric R. Miller, Albany, NY (US); John R. Sporre, Albany, NY (US); Sean Teehan, Rensselaer, NY (US)

(73) Assignee: Tessera, LLC, San Jose, CA (US)

( * ) Notice: Subject to any disclaimer, the term of this patent is extended or adjusted under 35 U.S.C. 154(b) by 157 days.

(21) Appl. No.: 16/834,548

(22) Filed: Mar. 30, 2020

(65) Prior Publication Data

US 2020/0235094 A1  Jul. 23, 2020

Related U.S. Application Data

(60) Continuation of application No. 16/002,590, filed on Jun. 7, 2018, now Pat. No. 10,607,991, which is a
(Continued)

(51) Int. Cl.
*H01L 21/76* (2006.01)
*H01L 27/088* (2006.01)
(Continued)

(52) U.S. Cl.
CPC ...... *H01L 27/0886* (2013.01); *H01L 21/7682* (2013.01); *H01L 21/76897* (2013.01); *H01L 21/823431* (2013.01); *H01L 21/823468* (2013.01); *H01L 21/823475* (2013.01); *H01L 21/823481* (2013.01); *H01L 27/088* (2013.01); *H01L 29/41791* (2013.01);
(Continued)

(58) Field of Classification Search
CPC ......... H01L 21/31111; H01L 29/66795; H01L 29/6653; H01L 29/45; H01L 29/4966; H01L 27/0886
USPC .......................... 438/421, 411; 257/522, 410
See application file for complete search history.

(56) References Cited

U.S. PATENT DOCUMENTS 7,622,761 B2  11/2009  Park et al.
8,637,384 B2  1/2014  Ando et al.
(Continued)

OTHER PUBLICATIONS

List of IBM Patents or Patent Applications Treated as Related dated Dec. 7, 2016, 2 pages.
(Continued)

*Primary Examiner* — Tan N Tran
(74) *Attorney, Agent, or Firm* — Haley Guiliano LLP

(57) ABSTRACT

A method of forming a semiconductor device that includes forming a trench adjacent to a gate structure to expose a contact surface of one of a source region and a drain region. A sacrificial spacer may be formed on a sidewall of the trench and on a sidewall of the gate structure. A metal contact may then be formed in the trench to at least one of the source region and the drain region. The metal contact has a base width that is less than an upper surface width of the metal contact. The sacrificial spacer may be removed, and a substantially conformal dielectric material layer can be formed on sidewalls of the metal contact and the gate
(Continued)

structure. Portions of the conformally dielectric material layer contact one another at a pinch off region to form an air gap between the metal contact and the gate structure.

17 Claims, 16 Drawing Sheets

Related U.S. Application Data continuation of application No. 15/786,828, filed on Oct. 18, 2017, now Pat. No. 10,043,801, which is a division of application No. 15/371,350, filed on Dec. 7, 2016, now Pat. No. 10,553,581, which is a continuation of application No. 15/173,132, filed on Jun. 3, 2016, now Pat. No. 9,608,065.

(51) Int. Cl.
| | | |
|---|---|---|
| *H01L 29/49* | (2006.01) | |
| *H01L 29/45* | (2006.01) | |
| *H01L 29/66* | (2006.01) | |
| *H01L 21/8234* | (2006.01) | |
| *H01L 21/768* | (2006.01) | |
| *H01L 29/417* | (2006.01) | |

(52) U.S. Cl.
CPC ............ *H01L 29/45* (2013.01); *H01L 29/495* (2013.01); *H01L 29/4966* (2013.01); *H01L 29/4991* (2013.01); *H01L 29/6653* (2013.01); *H01L 29/6656* (2013.01); *H01L 29/66545* (2013.01); *H01L 29/66795* (2013.01); *H01L 21/823418* (2013.01); *H01L 2221/1063* (2013.01)

(56) References Cited

U.S. PATENT DOCUMENTS

| | | | |
|---|---|---|---|
| 8,637,930 B2 * | 1/2014 | Ando | H01L 29/785 |
| | | | 257/347 |
| 8,841,711 B1 | 9/2014 | Cai et al. | |
| 8,916,936 B2 | 12/2014 | Lee et al. | |
| 8,957,469 B2 | 2/2015 | Isomura et al. | |
| 9,123,774 B2 | 9/2015 | Suk et al. | |
| 9,379,123 B2 | 6/2016 | Sim et al. | |
| 9,536,982 B1 * | 1/2017 | Cheng | H01L 29/517 |
| 9,608,065 B1 | 3/2017 | Bergendahl et al. | |
| 9,786,767 B2 | 10/2017 | Leobandung | |
| 9,871,121 B2 * | 1/2018 | Xu | H01L 29/785 |
| 10,043,801 B2 | 8/2018 | Bergendahl et al. | |
| 10,062,763 B2 * | 8/2018 | Bao | H01L 21/288 |
| 10,784,360 B2 * | 9/2020 | Sung | H01L 29/42368 |
| 2008/0217775 A1 | 9/2008 | Pai et al. | |
| 2013/0092984 A1 | 4/2013 | Liu et al. | |
| 2013/0224141 A1 | 8/2013 | Zhao et al. | |
| 2014/0001520 A1 | 1/2014 | Glass et al. | |
| 2015/0021683 A1 | 1/2015 | Xie et al. | |
| 2015/0243760 A1 | 8/2015 | He et al. | |
| 2017/0103981 A1 | 4/2017 | Hung et al. | |
| 2019/0267279 A1 | 8/2019 | Cheng et al. | |
| 2020/0235094 A1 | 7/2020 | Bergendahl et al. | |

OTHER PUBLICATIONS

List of IBM Patents or Patent Applications Treated as Related dated Oct. 18, 2017, 2 pages.

* cited by examiner

AIR GAP SPACER FOR METAL GATES

RELATED APPLICATION INFORMATION

This application is a continuation of U.S. patent application Ser. No. 16/002,590, filed on Jun. 7, 2018, which is a continuation of U.S. patent application Ser. No. 15/786,828, filed on Oct. 18, 2017, now U.S. Pat. No. 10,043,801, issued on Aug. 7, 2018, which is a divisional of U.S. patent application Ser. No. 15/371,350, filed on Dec. 7, 2016, now U.S. Pat. No. 10,553,581, issued on Feb. 4, 2020, which is a continuation of U.S. patent application Ser. No. 15/173,132, filed on Jun. 3, 2016, now U.S. Pat. No. 9,908,065, issued on Mar. 28, 2017, all of which are incorporated herein by reference in their entirety.

BACKGROUND

Technical Field

The present disclosure relates to integrated circuits and the fabrication thereof. More particularly, the present disclosure relates to fabricating field effect transistors (FETs) that include fins (fin-FETs) while protecting against parasitic capacitance and protecting high K materials of a replacement metal gate structure when building in insulating air gaps.

Description of the Related Art

Multi-gate FETs may experience in high parasitic capacitance. Insulating selected regions of the device may reduce the parasitic capacitance, however, the processing employed to add insulation may harm other device components, such as a high dielectric constant material (high k material) that is part of a replacement metal gate structure, e.g., a gate structure formed in replacement of a sacrificial gate structure. For example, in taking steps to improve the insulating characteristics, processing near the gate may lead to the exposure of and damage to high k material situated around the metal gates.

SUMMARY

In accordance with one aspect of the present disclosure, a transistor device is provided that includes air gap structures adjacent to gate structures. In one embodiment, the transistor device may include metal gate structures located between the source and drain regions, and metal contacts formed on the source and drain regions and spaced from the metal gate structures. The metal contacts may include a first width portion that is proximate to the source and drain regions, in which the width of the metal contacts tapers to a larger second width in a direction away from the source and drain regions. In some embodiments, a substantially conformal dielectric layer is present on at least the sidewalls of the metal contacts and sidewall of the metal gate structures, the substantially conformal dielectric layer having a pinched off region that seals air gaps between the metal contacts and the metal gate structures. The pinched off region may be proximate to the second width of the metal contact.

In another aspect of the present disclosure, a method of forming a semiconductor device is provided. In some embodiments, the method may include forming a trench in an interlayer dielectric layer that is adjacent to at least one gate structure to expose an electrical contact surface to one of a source region and a drain region. A sacrificial spacer may be formed on sidewalls of the trench. The sacrificial spacer has a base width greater than a width of an upper surface of the gate structure. A metal contact may then be formed in the trench to at least one of the source region and the drain region, wherein the metal contact has a base width that is less than an upper surface width of the metal contact. The sacrificial spacer may be removed, and a substantially conformal dielectric material layer can be formed on sidewalls of the metal contact and the gate structure that are exposed by removing the sacrificial spacer. Portions of the conformally dielectric material layer contact one another at a pinch off region that is proximate to the upper surface width of the metal contact to form an air gap between the metal contact and the gate structure.

In another embodiment, the method of forming a semiconductor device may include forming trenches in an interlayer dielectric layer between adjacent metal gate structures. The trenches are positioned over source and drain region portions of a fin structure. A sacrificial spacer is formed on sidewalls of the trench. The sacrificial spacer has a base width greater than an upper surface. A metal contact is formed in the trench in electrical communication with at least one of the source region portion and the drain region portion of the fin structure. The metal contact has a base width that is less than an upper surface width of the metal contact. The sacrificial spacer may then be removed. A substantially conformal dielectric material layer may be formed on sidewalls of the metal contact and the gate structure that are exposed by removing the sacrificial spacer. Portions of the conformal dielectric material layer contact one another at a pinch off region that is proximate to the upper surface width of the metal contact to form an air gap. The air gap may entirely fill the space between the metal contact and the gate structures.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
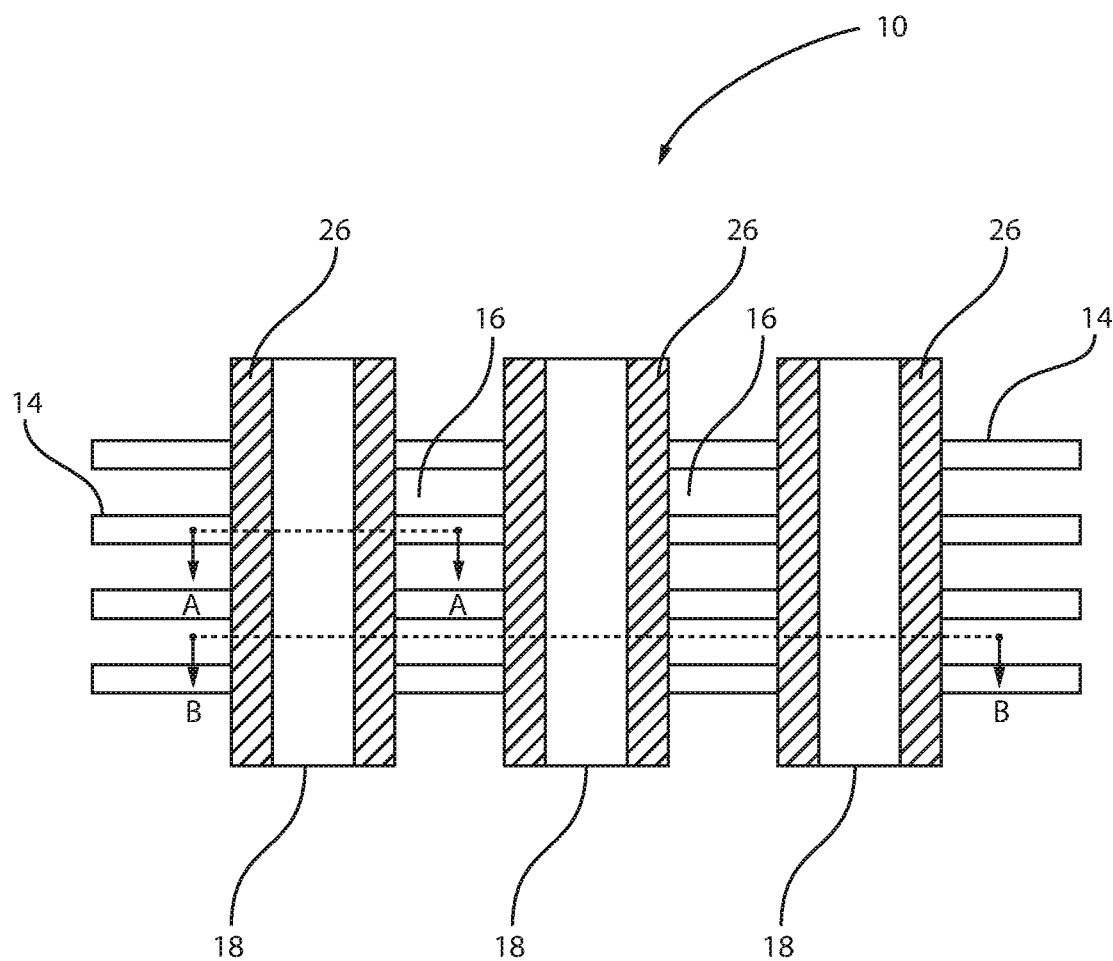
FIG. 1 is a top plan view of a semiconductor device at a stage of fabrication illustrating fin structures having a gate structure present thereon, in which section line A-A is along a cross-section through the length of a fin structure, and section line B-B provides a cross-section through a portion of the device between adjacent fin structures in which the epitaxial semiconductor material for one of a source region or a drain region would be present, in accordance with one embodiment of the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C)

only, or the selection of all three options (A and B and C). This may be extended, as readily apparent by one of ordinary skill in this and related arts, for as many items listed.

As described herein, a method of forming a semiconductor device is provided with air gap spacers that protects the sensitive high-k dielectric material of the metal gate structures near the metallization layers (which provide a metal contact) over the source and drain regions of the device. In some embodiments, this is done through a sequence of adding and removing sacrificial spacer materials in the locations between the metal layers in the source and drain regions of the device and the body of the gate structure of the device.

For example, a semiconductor device may be formed including fin structures, source and drain regions, and gate structures. In one embodiment, the semiconductor device is formed using a replacement metal gate (RMG) structure. A replacement metal gate structure is provided by a process sequence, in which a sacrificial gate structure is initially formed on the channel region of the device, and later replaced with a metal gate structure that produces a functional gate structure. The functional gate structure functions to switch the semiconductor device from an "on" to "off" state, and vice versa. This process sequence may also be referred to as a gate last sequence. The gate last process sequence allows for device features, such as, e.g., epitaxial growth of source and drain regions, to be formed while the sacrificial gate structure is in place and before forming the functional gate structure. This provides that the functional gate structure is not subjected to certain process conditions that the sacrificial gate structure is subjected to.

The functional gate structure (also referred to as replacement metal gate (RMG) structure) may be capped with a silicon nitride material and a first spacer material may be formed around the replacement metal gate structure. As will be described herein, the spacer material (or portions thereof) may be removed at a later time. An interlayer dielectric material (ILD) may then be deposited over the structure, with a silicon anti-reflective coating (SiARC) and an organic planarization layer (OPL) being formed over the ILD layer. This arrangement is configured for trench formation, e.g., the trenches are formed in the source and drain regions between the gate structures, and metal materials may be deposited over the source and drain regions. The trenches and the deposited metal materials may provide contacts to the source and drain regions, as well as other active regions of the device.

In one embodiment, after the trenches are formed in the ILD material between in the source/drain regions, the sacrificial spacer material is removed, a portion of the high-k dielectric material of the replacement metal gate structures is removed, a second spacer material is deposited in conformance to the structure, metallization layers are formed over the source/drain regions, the second spacer material is removed, and air gaps are formed between the metallization layers and the replacement metal gate structures that are defined by a third spacer material that forms air gap pinch off region in locations between the metallization layers and the replacement metal gates. A semiconductor device is provided having a structure that has little to no parasitic capacitance and in which the high-k dielectric material is not damaged.

Spacer materials may be formed in the trenches, both before and after metal deposition, the presence of which may shape the metal formation, i.e., metal contacts, and upon removal provide for air gap formation with pinch off regions. In one embodiment, a spacer material is deposited in the space between the replacement metal gate structures and the metal materials for the contacts that is produced by removing sacrificial spacers, in which the spacer material forms a pinch off seal preventing further spacer material from entering the space. The pinch off seal produced by the conformal spacer material leaves an air gap in the space between the replacement metal gates and the metallization formations, e.g., metal contacts, providing air gap insulation in addition to insulation that may be provided by other materials, e.g., low k dielectric spacer material formed in conformance to the walls of the replacement metal gate and metallization formations.

Referring now to the drawings in which like numerals represent the same or similar elements and initially to FIG. 1, depicted is a top plan view showing perspectives views of a one embodiment of a partial semiconductor device 10, with line A-A showing the perspective of a view through a fin 14 and line B-B showing the perspective of a view through a space 16 present between adjacent fin structures 14. This region of the device may be filled with epitaxial semiconductor material contacting the source and drain regions, e.g., merged source and drain epitaxial semiconductor material. Gates 18 positioned within spacers 26 are shown extending perpendicular to the fin structures 14. The view of FIG. 1 is simplified by omitting other parts of the device.

Figure 2A:
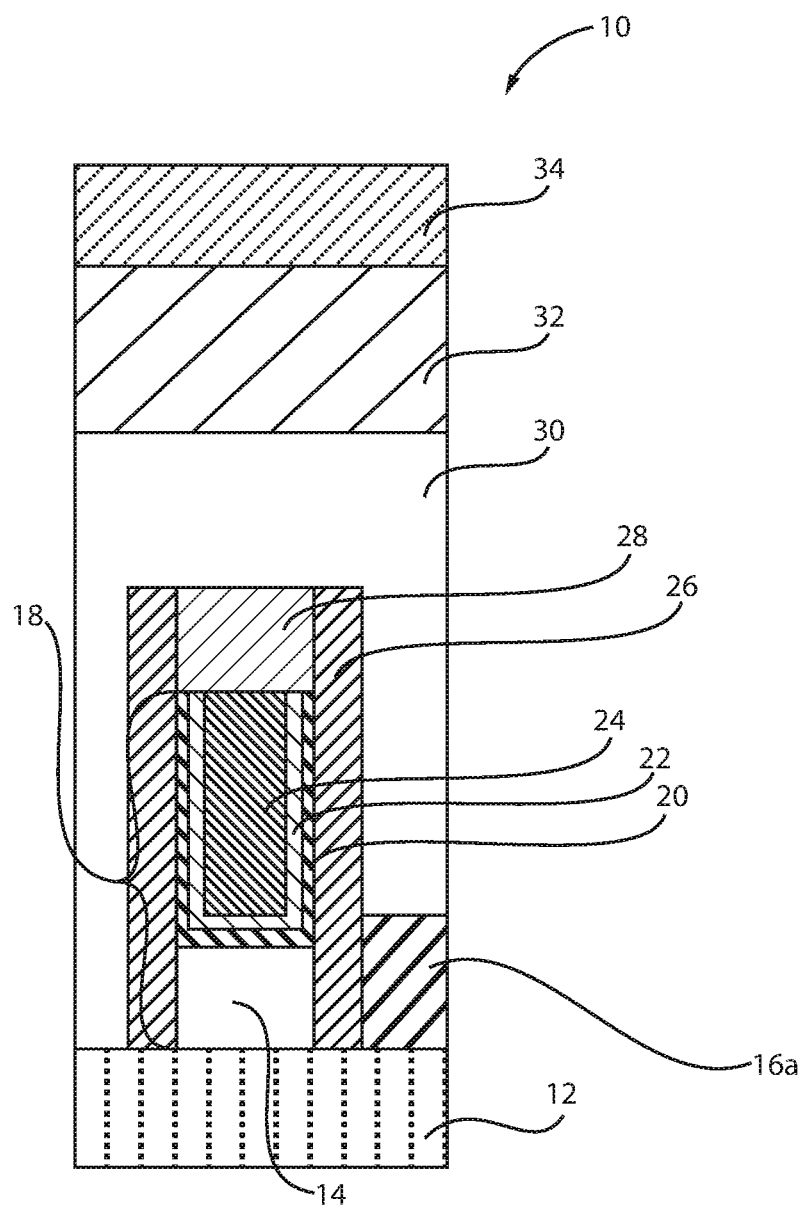
FIG. 2A depicts a side cross-sectional view through the length of a fin structure of the device (similar to the cross-section along section line A-A in FIG. 1) at a stage of fabrication in which a replacement metal gate structure has been fabricated and an anti-reflection coating and an organic planarization layer have been deposited atop the fin structures and metal gate structure, in accordance with one embodiment of the present disclosure.
Figure 2B:
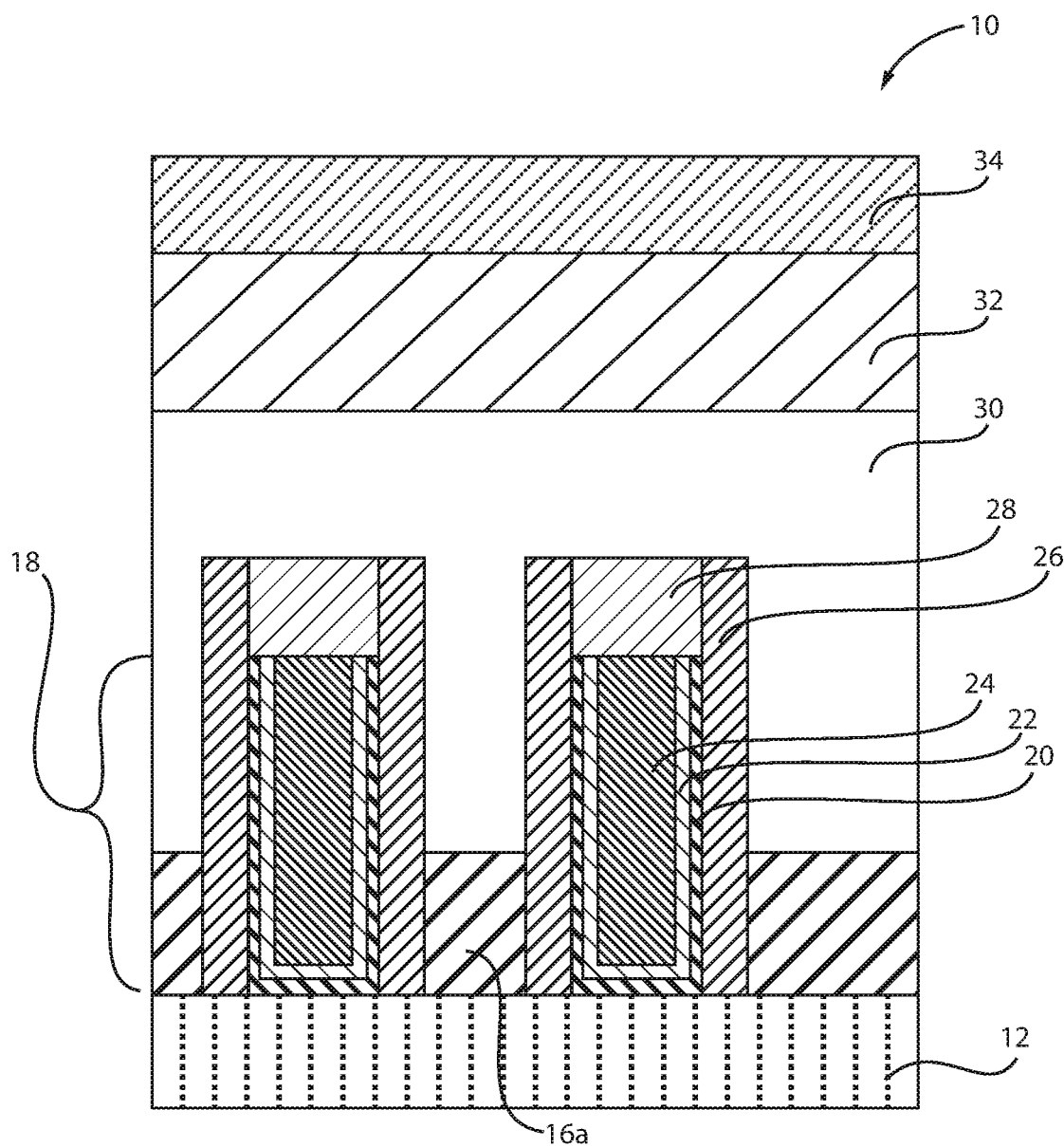
FIG. 2B depicts a side cross-sectional view in the space between adjacent fin structures (similar to cross-section along section line B-B in FIG. 1) at the stage of fabrication of FIG. 2A, in accordance with one embodiment of the present disclosure.

Referring to FIGS. 2A and 2B, fin structures 14 are formed on a semiconductor substrate 12. The semiconductor substrate 12 may be made from a semiconductor material, such as, silicon, germanium and silicon-germanium alloy, among other materials and alloys. In the described embodiment according to present principles, the semiconductor substrate material is silicon.

The device is provided with a replacement metal gate structure 18 shown passing over the fins 14. A sacrificial gate structure may have been previously formed from polycrystalline silicon, and then replaced with the metal gate structure 18 in a gate last configuration after other aspects of the device are formed, for example, after the source and drain regions 16 are formed by epitaxial growth.

Replacement metal gate (RMG) structures 18 may include a gate metal material 24, such as tungsten (W); a work function metal 22, such as titanium nitride (TiN); and a gate dielectric material 20, such as a high-k gate dielectric. The term "high-k" as used to describe the material of the gate dielectric layer 30 denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In one embodiment, the gate dielectric material 20 is composed of a high-k oxide, such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the gate dielectric material 20 include hafnium silicate, hafnium silicon oxynitride or combinations thereof.

It is noted that titanium nitride (TiN) is only one example of a metal containing material that can be used for the work function metal 22. Other examples of work function metals for the replacement metal gate (RMG) gate structures 18 include ruthenium, titanium aluminum, aluminum nitride, and tantalum carbide.

It is noted that tungsten (W) is only one example of a composition that can provide the gate metal material 24. In other embodiments, the gate metal material 24 may be tantalum (Ta), aluminum (Al), platinum (Pt), gold (Au), silver (Ag), copper (Cu) and alloys thereof.

Referring to FIGS. 2A and 2B, the gate dielectric material 20 may surround the work function metal 22 and the gate metal material 24. In some embodiments, the gate structure 18 may be capped with a dielectric material 28, such as silicon nitride, silicon oxide or silicon oxynitride. A spacer material 26 surrounds the replacement metal gate (RMG) structure 18. The spacer material 26 may be composed of a dielectric material, such as an oxide, nitride or oxynitride material, that is suitable for sacrifice, e.g., at a later time in the process flow described herein. In some embodiments, the spacer material 26 may be a silicon oxynitride, e.g., SiNO, or the spacer material may be a silicon boron carbon nitride (SiBCN) material. The spacer material 26 may, in such instances, be regarded as a sacrificial gate material.

An epitaxial growth material 16a of a semiconductor material, such as crystalline silicon is formed in the source and drain regions of the device. The epitaxial growth occurs on both sides of the replacement metal gate structure 18. The epitaxial growth material 16a may be silicon, germanium, a silicon-germanium (SiGe) alloy and/or carbon doped silicon (Si:C). In the described embodiment, the epitaxial growth material 16a is SiGe. The SiGe layer can be formed, for example, by a selective epitaxial process using a combination of silicon-containing gas, a germanium-containing gas, a carrier gas, and optionally, an etchant gas. The silicon containing gas may be a gas such as silane ($SiH_4$), dichlorosilane ($SiH_2Cl_2$), disilane ($Si_2H_6$), trisilane ($Si_3H_8$) or tetrasilane ($Si_4H_{10}$). The germanium containing gas may be a gas such as germane ($GeH_4$) or digermane ($Ge_2H_6$). The carrier gas may be a gas such as nitrogen, hydrogen, or argon. The optional etchant gas may be a gas such as hydrogen chloride (HCl) or chlorine ($Cl_2$). The formation may occur at a temperature ranging from about 450° C. to about 900° C. The SiGe layer may have a Ge concentration of about 15% to about 100%, preferably from about 20% to about 60%.

Further, an interlayer dielectric material (ILD) 30 may be deposited over the substrate 12, the epitaxial growth material 16a within the source and drain regions, fin structures 14, gate structure 18, spacer 26 and cap 28. ILD material 30 may be selected from silicon containing materials such as $SiO_2$, $Si_3N_4$, $SiO_xN_y$, SiC, SiCO, SiCOH, and SiCH compounds, with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon ($\alpha$-C:H)). Additional choices for the ILD material include any of the aforementioned materials in porous form, or in a form that changes during processing to or from being porous and/or permeable to being non-porous and/or non-permeable.

Still referring to FIGS. 2A and 2B, a silicon anti-reflective coating (SiARC) 34 and an organic planarization layer (OPL) 32 are formed over the ILD layer 30. The exemplary anti-reflective coating (SiARC) 34 and an organic planarization layer (OPL) 32 can be replaced or substituted by any other known or unknown pattering methodology used to determine the placement of the source/drain regions in the exemplary dielectric material (ILD) 30.

Figure 3A:
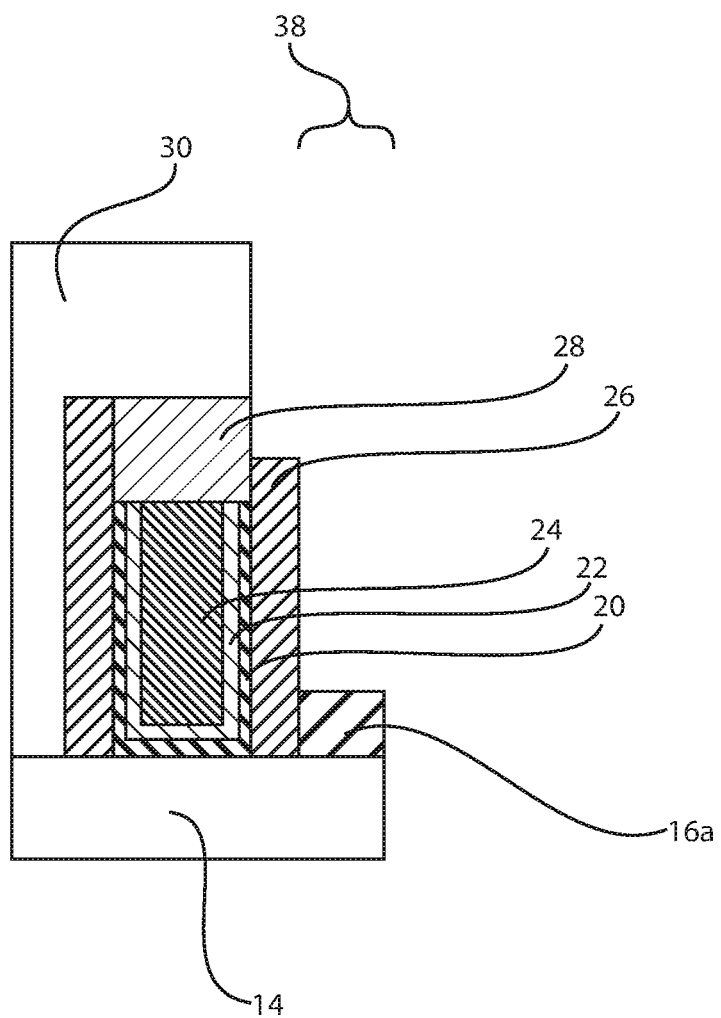
FIG. 3A depicts a side cross-sectional view through the length of a fin structure of the device (similar to the cross-section along section line A-A in FIG. 1) at a stage of fabrication in which the anti-reflection coating and the organic planarization layer are removed and trenches are formed, in accordance with one embodiment of the present disclosure.
Figure 3B:
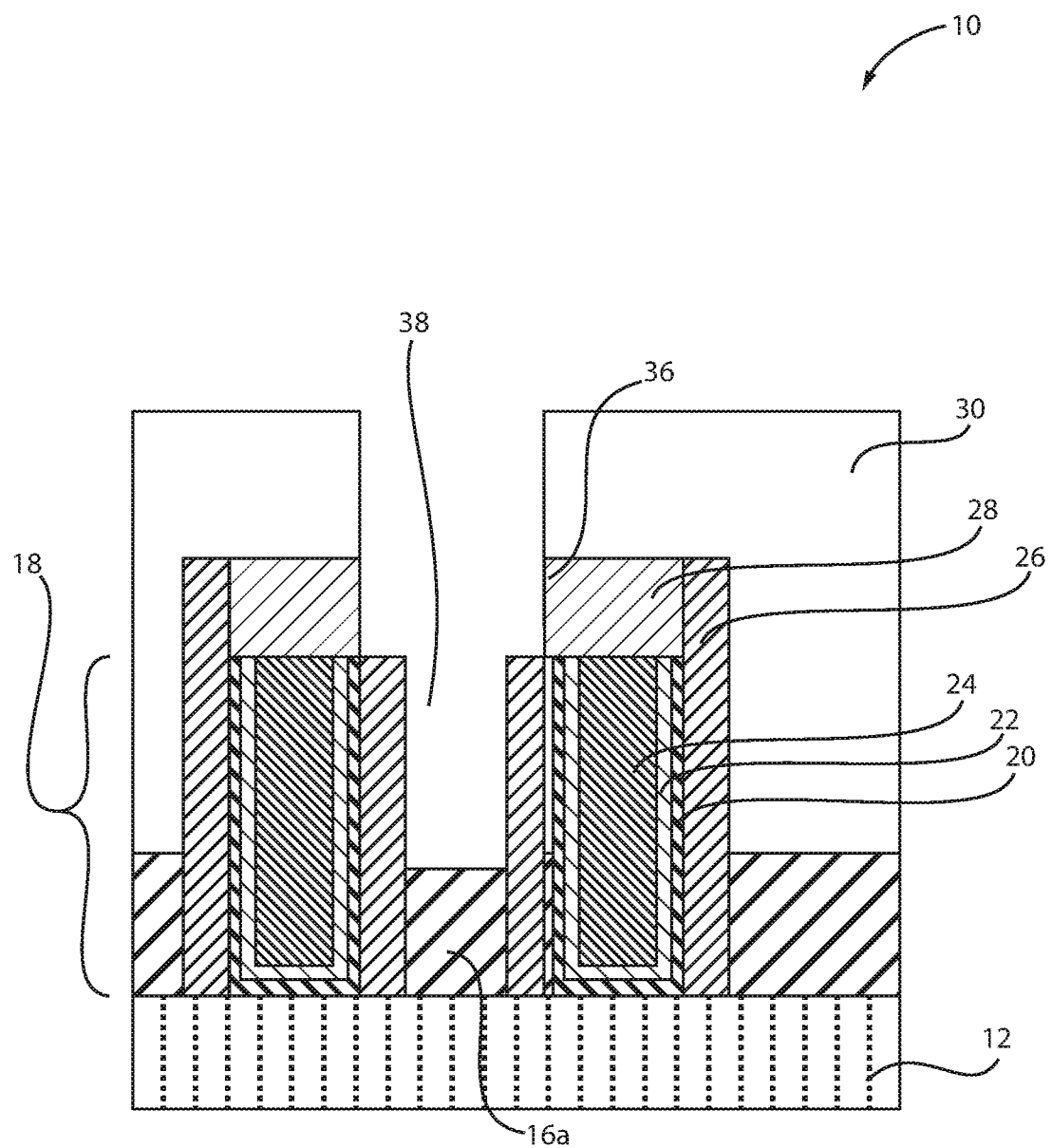
FIG. 3B depicts a side cross-sectional view in the space between adjacent fin structures (similar to cross-section along section line B-B in FIG. 1) at the stage of fabrication of FIG. 3A, in accordance with one embodiment of the present disclosure.

Referring to FIGS. 3A and 3B, shown is device 10 at a stage of fabrication in which the anti-reflective coating layer 34 and the organic planarization layer 32 are removed, and a trench 38 is formed between replacement metal gates 18 by removing the ILD material 30 and portions of the spacer material 26 from the space between the replacement metal gates 18. The spacer material 26 may also be removed from near the top of the replacement metal gate structures 18. Forming trenches 38 exposes the epitaxial growth material 16a in the source and drain regions of the device 10. The ILD material 30 may be removed by anisotropic etching, in which the etch rate in the direction normal to the etched surface is greater than in the direction parallel to the etched surface. The anisotropic etch may be performed by reactive-ion etching (ME). Other examples of anisotropic etching that can be used at this point of the proceedings include ion beam etching, plasma etching or laser ablation.

In an embodiment, the placement and alignment of trenches 38 with respect to the replacement metal gate structures 18 does not have to be exact. FIGS. 3A and 3B shows misalignment region that may be formed with removal of portions of the spacer 26 and the exposure of the epitaxial growth material 16a in the source and drain regions. Misalignments become inconsequential with later processing steps described herein.

Figure 4:
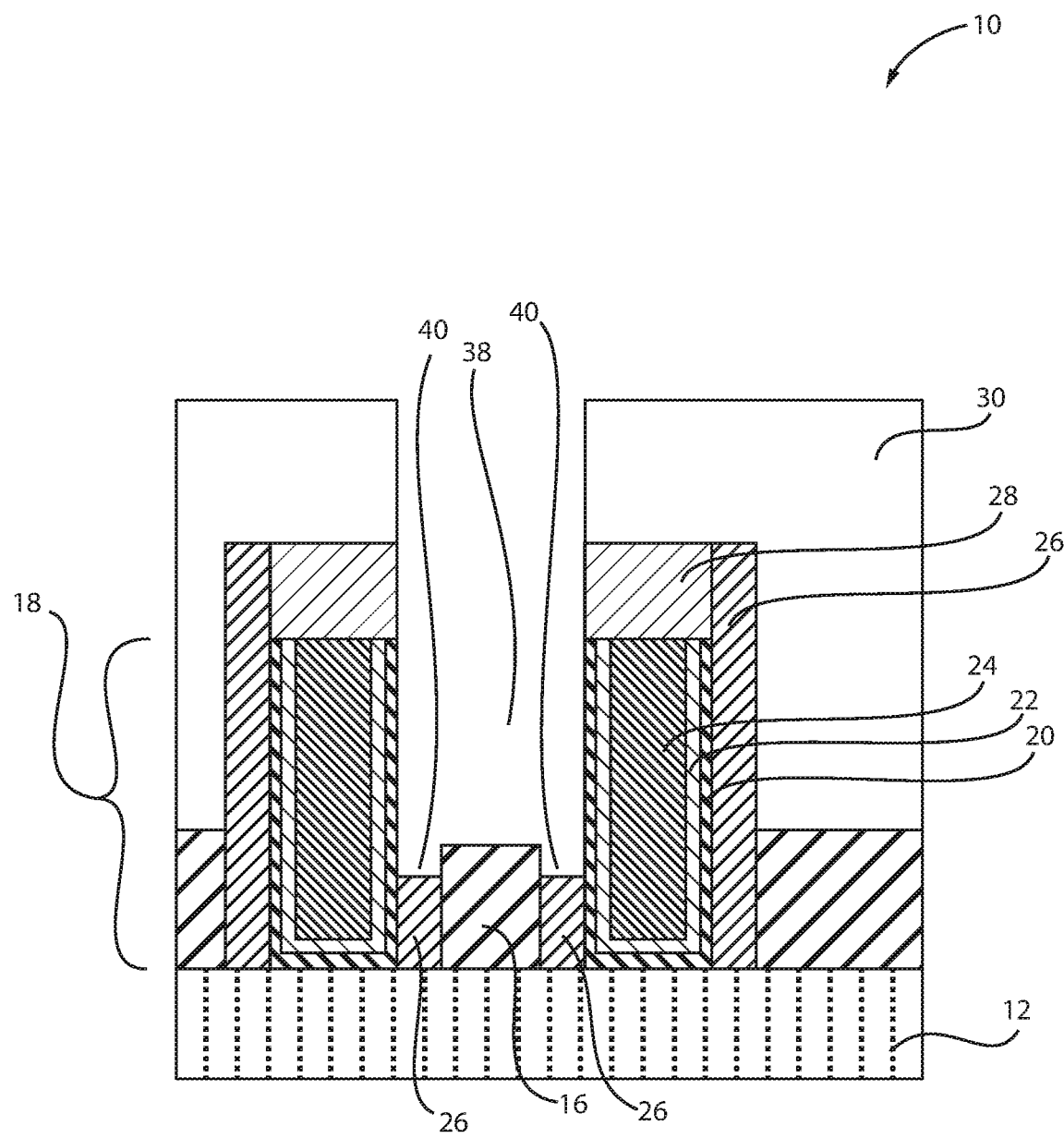
FIG. 4 depicts a side cross-sectional view in the space between adjacent fin structures (similar to cross-section along section line B-B in FIG. 1) at the stage of fabrication in which a first spacer material is removed, in accordance with one embodiment of the present disclosure.

Referring to FIG. 4, the device 10 is shown at a stage of device fabrication in which an isotropic etch is performed to remove a portion of the spacer material 26 to a location that is below the top of the epitaxial growth material 16a of the source and drain regions, while leaving a portion of spacer materials 26, i.e., remnant spacer portion, at the bottom of the trench 38 between the epitaxial semiconductor material 16a of the source and drain regions and the replacement metal gates 18. The removal of spacer material 26 to this extent forms a space 40 between the source/drain regions 16 and the replacement metal gates 18. The etching may be done by ME, which is selective to the SiNO/SiBCN spacer material 26. The etch may also be conducted by a wet chemical etch or a gas plasma etch and any etch process in which the etching occurs isotropically, e.g., non-directionally, where the etch rate is not substantially greater in any one direction in comparison to all of the etch directions.

Figure 5:
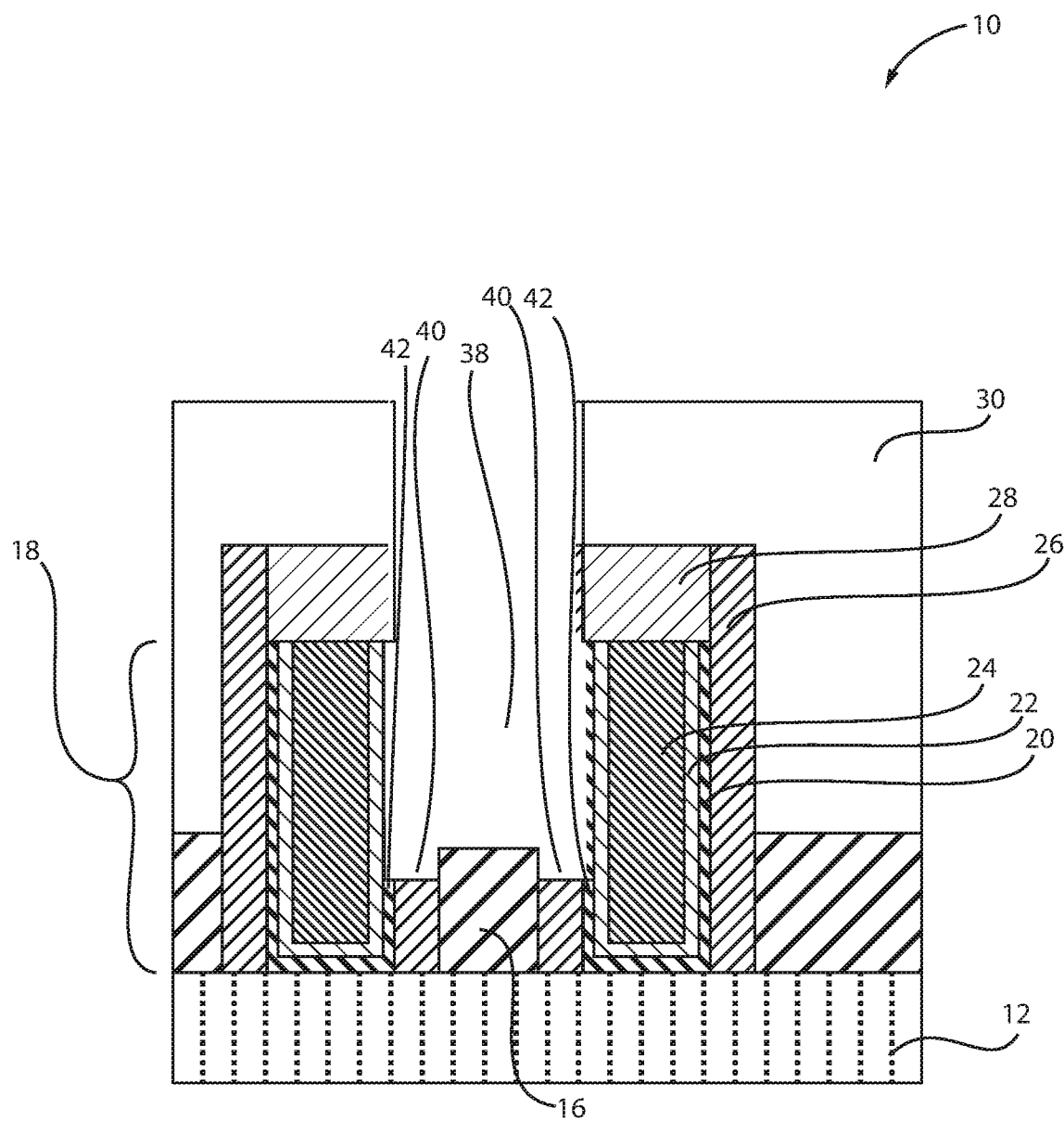
FIG. 5 depicts a side cross-sectional view in the space between adjacent fin structures (similar to cross-section along section line B-B in FIG. 1) at a stage of fabrication in which a portion of high-k dielectric material is removed from the metal gate structure in accordance with one embodiment of the present disclosure.

Referring to FIG. 5, shown is device 10 at a stage of fabrication in which an isotropic etch is performed to remove the high-k dielectric material 20 from the replacement metal gates 18 that has been exposed in forming the trenches 36. In removing the high-k dielectric material 20, a recess 42 forms above where the high-k dielectric material still remains, in the space between the spacer material 26 and the work function metal 22 of the replacement gate structure 18. The isotropic etch may be a ME, a wet chemical etch, or a gas plasma etch. The size and dimensions of the recess 42 defined by the thickness of the high-k dielectric material 20 and the isotropic etch process that is used. The recess 42 may be configured to end above the fin 14 and source/drain region 16 as not to impact device performance though air exposure to active device region high-k dielectric material.

Figure 6:
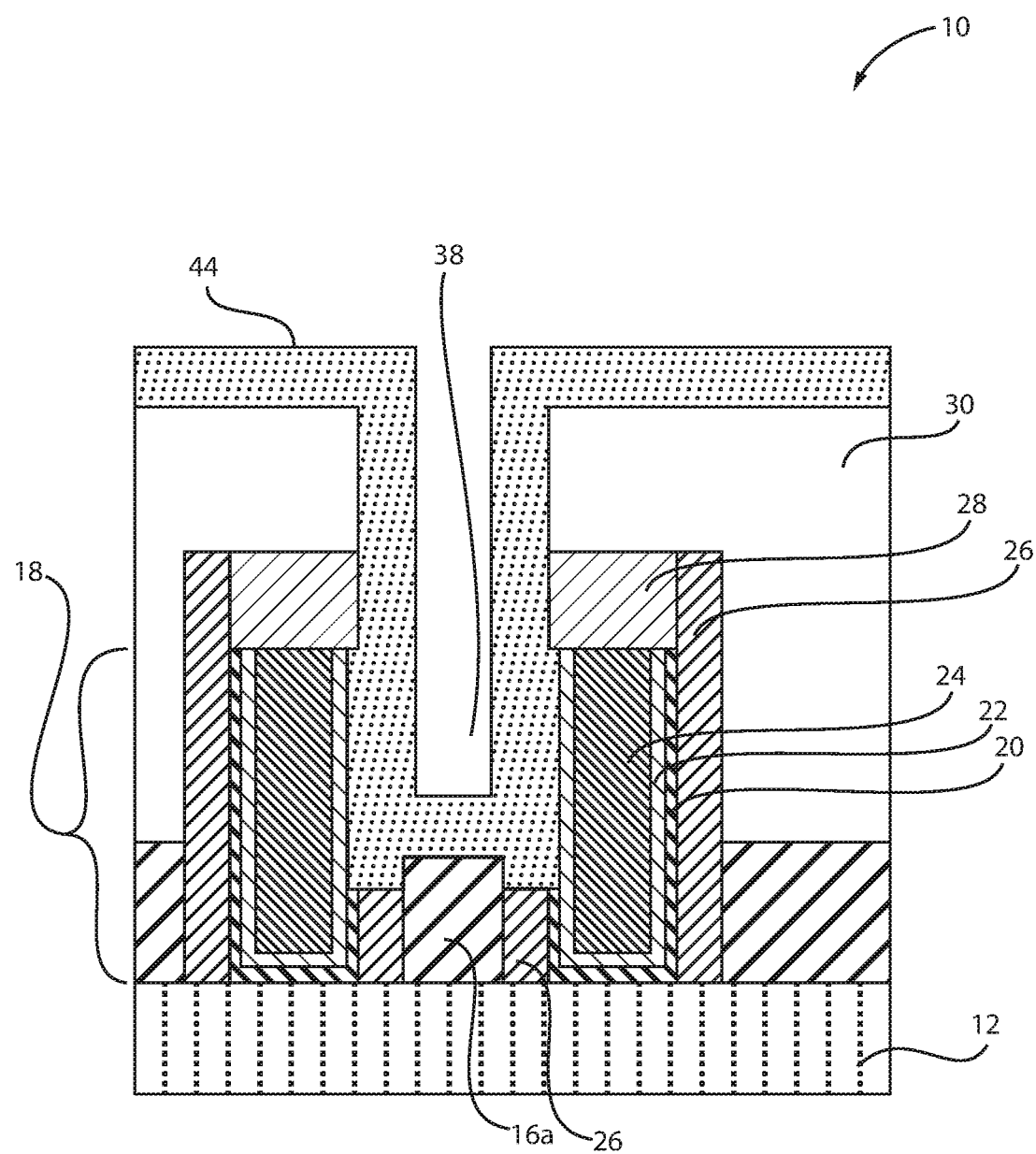
FIG. 6 depicts a side cross-sectional view through the space between adjacent fin structures (similar to cross-section along section line B-B in FIG. 1) at a stage of fabrication following FIG. 5, in which a second spacer material is formed in accordance with one embodiment of the present disclosure.

Referring to FIG. 6, shown is device 10 at a stage of fabrication in which a new spacer material, here referred to as a second spacer material, is deposited on the structure. The second spacer material 44 may be formed by depositing a conformal layer of dielectric material, such as oxides, nitrides or oxynitrides and combinations thereof along the top of the device and in trenches 38, where the trench sidewalls and trench bottom are covered by the second spacer material 44. In some embodiments, the second spacer material 44 is a continuous dielectric material layer on vertical surfaces of the trench sidewall and horizontal surfaces at a base of the trench. In some embodiments, the epitaxial semiconductor material 16a that has been formed on the source and drain portions of the fin structures are buried by the deposit of the second spacer material 44. Typically, the second spacer material 44 fills the spaces 40 and recesses 42 within the trench 38. The second spacer material 44 may be, but need not be, a dielectric. In some embodiments, the second spacer material 44 will cleanly decompose within a time and temperature range, and in an atmosphere, which will not adversely affect the function of other structural components. In some embodiments, an acceptable decomposition temperature would be at or about 350° C.-450° C. Examples of suitable materials to function as a second spacer material 44 include: polystyrenes; polymethyl methacrylates; polynorbornenes; and polypropylene glycols. Other examples may include oxides and nitrides. In one embodiment, the second spacer material 44 may be formed by using a blanket layer deposition, such as chemical vapor deposition. The second spacer material 44 may have a width ranging from about 2.0 nm to about 15.0 nm.

Figure 7A:
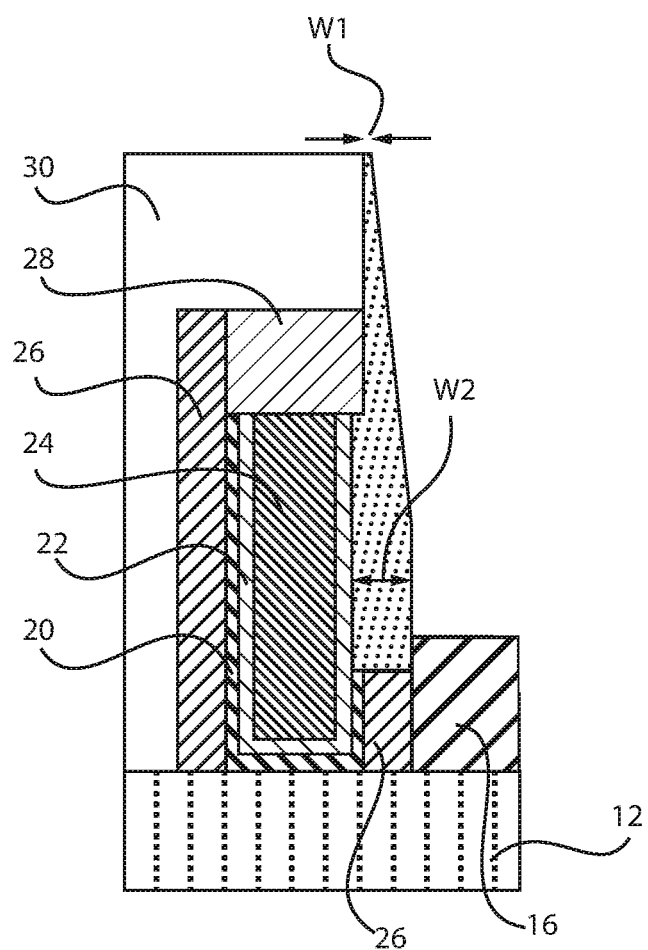
FIG. 7A depicts a side cross-sectional view through the length of a fin structure of the device (similar to the cross-section along section line A-A in FIG. 1) at a stage of fabrication in which the second spacer material is subjected to an anisotropic etching procedure to remove portions thereof, in accordance with one embodiment of the present disclosure.
Figure 7B:
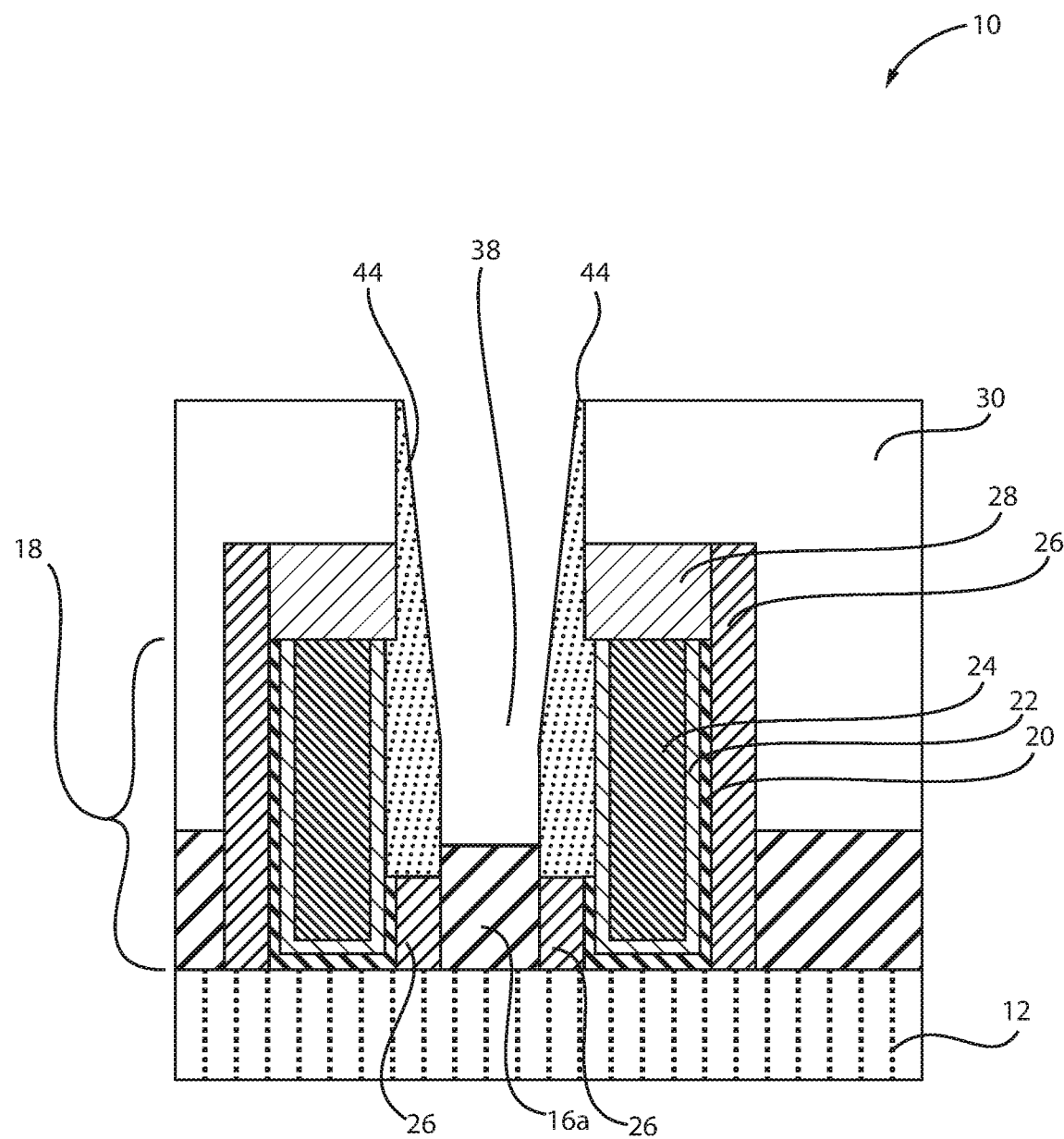
FIG. 7B depicts a side cross-sectional view in the space between adjacent fin structures (similar to cross-section along section line B-B in FIG. 1) at the stage of fabrication of FIG. 7A, in accordance with one embodiment of the present disclosure.

Referring to FIGS. 7A and 7B, depicted is a stage of device fabrication in which the second spacer material 44 is subjected to an anisotropic pull down etch, in which the material of the sacrificial spacer material 44 is removed from the top of the structure and the bottom of the trenches 38, exposing the epitaxial semiconductor material 16a of the source and drain regions. In some embodiments, the anisotropic pull down etch may include anisotropically etching the continuous dielectric material to remove the continuous dielectric material, i.e., sacrificial spacer material 44, from the horizontal surfaces of the trench and to reduce a width of the continuous dielectric material, i.e., sacrificial spacer material 44, at an upper surface of the vertical surfaces of the trench to provide a sacrificial spacer 44 (the remaining portion of the sacrificial spacer material may hereafter be referred to as a sacrificial spacer 44) having an upper surface with a width W1 less than a base surface width W2 of the sacrificial spacer 44. RIE may be used to effect the anisotropic pulldown, in which the etch rate is higher for horizontal surfaces (e.g., those surfaces on the top of the structure and over the source/drain regions) resulting in a tapered profile in the sacrificial spacer 44 that remains at the top of the device 10. The sacrificial spacer 44 remains in conformance with the sides of the trenches and is present along the replacement metal gate and the ILD material 30.

Figure 8:
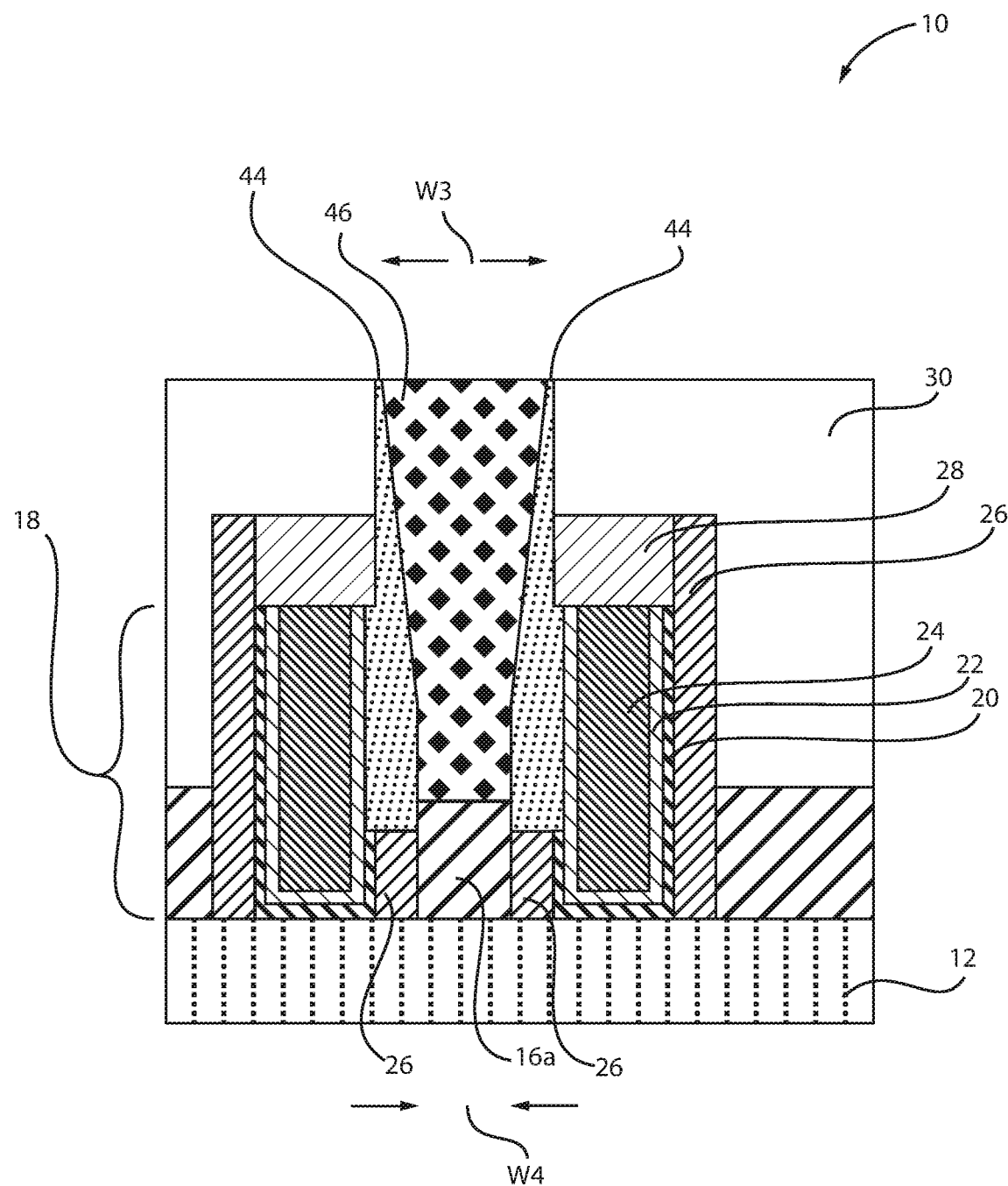
FIG. 8 depicts a side cross-sectional view through the space between adjacent fin structures (similar to cross-section along section line B-B in FIG. 1) at a stage of fabrication in which a metallization layer is formed in the trenches between the second spacer material in accordance with an embodiment of the present disclosure.

Referring to FIG. 8, shown is the device at a stage of fabrication in which a metallization layer is formed in the trenches 38. The metallization layer provides a metal contact 46 that in electrical communication with the source and drain regions. For example, the metal contact 46 may be in direct contact with an epitaxially formed semiconductor material 16a of at least one of the source region and the drain region. The metal contact 46 is situated between the replacement metal gate structures 18. The metal contact 46 may be formed using physical vapor deposition and (PVD) and chemical vapor deposition (CVD). Variations of CVD processes suitable for depositing the at least one first gate dielectric layer include, but are not limited to, atmospheric pressure chemical vapor deposition (APCVD), low pressure chemical vapor deposition (LPCVD), plasma enhanced chemical vapor deposition (PECVD), and metal organic chemical vapor deposition (MOCVD). Sputtering is an example of a PVD process. The metallization layer may be formed of a metal. Exemplary metals includes titanium (Ti), aluminum (Al), copper (Cu), tungsten (W), platinum (Pt), and gold (Au). The metallization layer may also be formed of a doped polysilicon. The metallization layer or layers 46 form source/drain contacts that are processed so that the resultant contact surface 47 of the metallization layer 46 upper surface is coplanar with the interlayer dielectric layer 30 and does not cover, e.g., overlap, the sacrificial second spacer 44.

The metal contact 46 completely fills the remainder of the opening for the trench 38. The metal contact 46 directly contacts the exposed sidewalls of the second spacers 44. The width W3 of the upper surface of the metal contact 46 is less than the width W4 of the base surface of the metal contact 46, in which the metal contact 46 tapers from the upper width W3 to the base width W4 of the metal contact 46.

Figure 9:
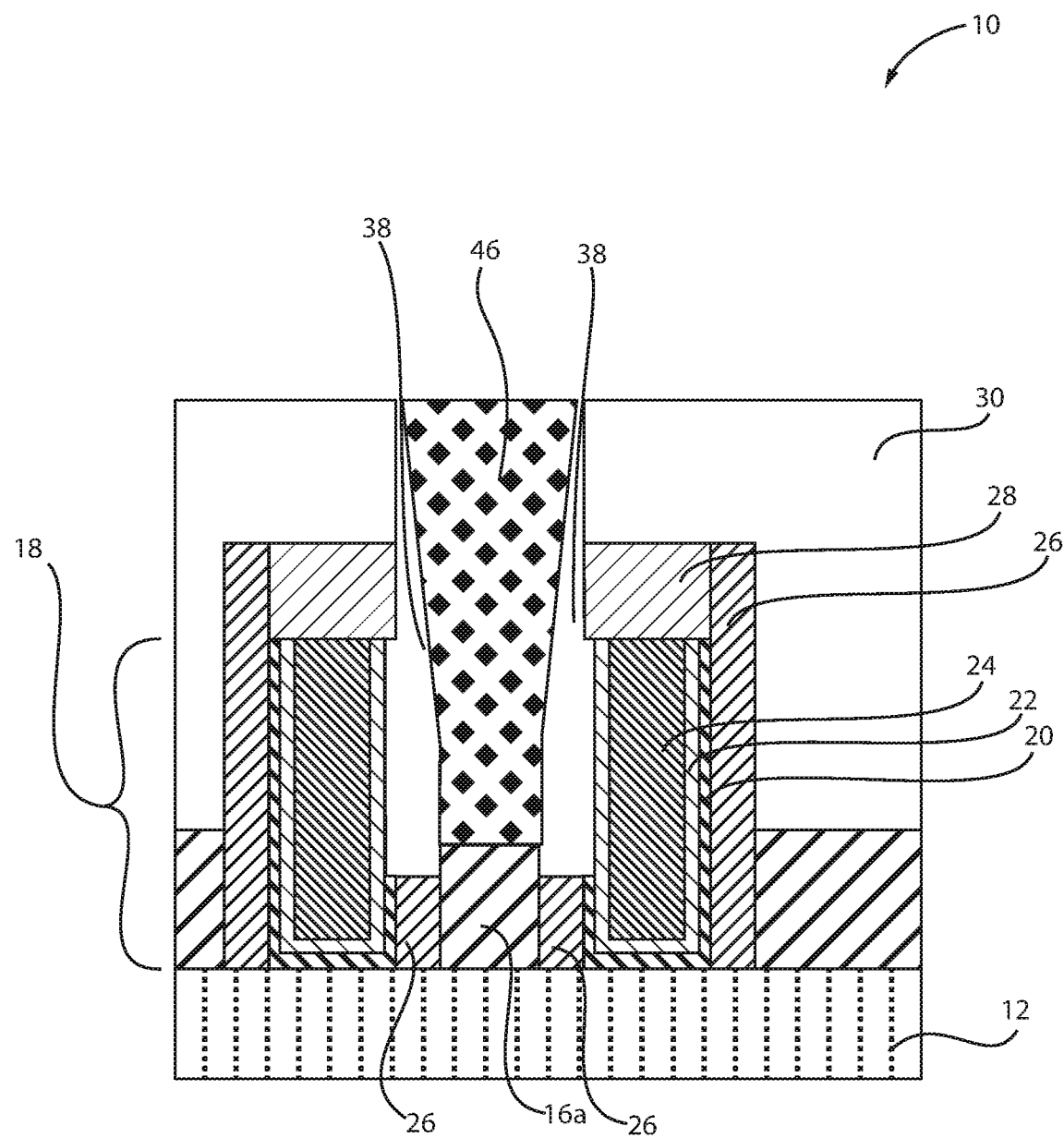
FIG. 9 depicts a side cross-sectional view through the space between adjacent fin structures (similar to cross-section along section line B-B in FIG. 1) at a stage of fabrication in which the second spacer material is removed from the trenches in accordance with one embodiment of the present disclosure.

Referring to FIG. 9, shown is the device at a stage of fabrication in which the sacrificial spacer 44 is removed. The sacrificial spacer 44 may be removed in a thermal annealing process. For example, the sacrificial spacer 44 may be thermally decomposed into a gas, wherein the gas out diffuses through an opening between the metal contact 46 and the gate structure 18. Thermal decomposition of the sacrificial spacer 44 may include annealing the structure depicted in FIG. 8 in a furnace having controlled, inert or vacuum atmosphere. The increase in temperature is slowly ramped to about 350° C. to 450° C. for a time sufficient to complete removal of the sacrificial spacer 44 and its decomposition by-products. The end point may be monitored using a mass spectrometer. The thermal decomposition method may continue until an entirety of the sacrificial spacer 44 has decomposed, leaving air dielectric, i.e., gaseous air, i.e., no solid material, in its place. In another embodiment, the second spacer material 44 is removed in a selective etching process. Annealing may be preferred to prevent further modification of recess 42 or modification of remaining high-k dielectric material 20.

Figure 10A:
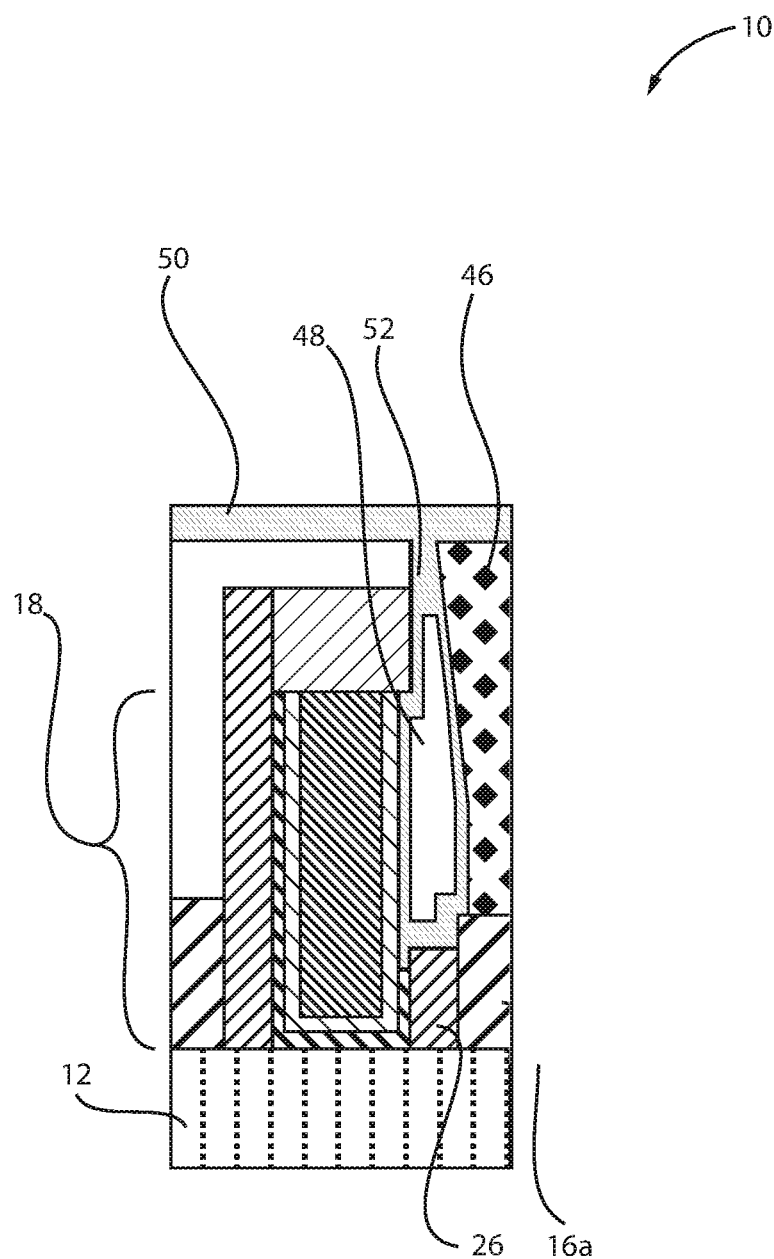
FIG. 10A depicts a side cross-sectional view through the length of a fin structure of the device (similar to the cross-section along section line A-A in FIG. 1) at a stage of fabrication in which a third spacer material is deposited in conformance with the metallization layer and the metal gate structures, forming air gaps and an air gap pinch off region, in accordance with an embodiment of the present principles.
Figure 10B:
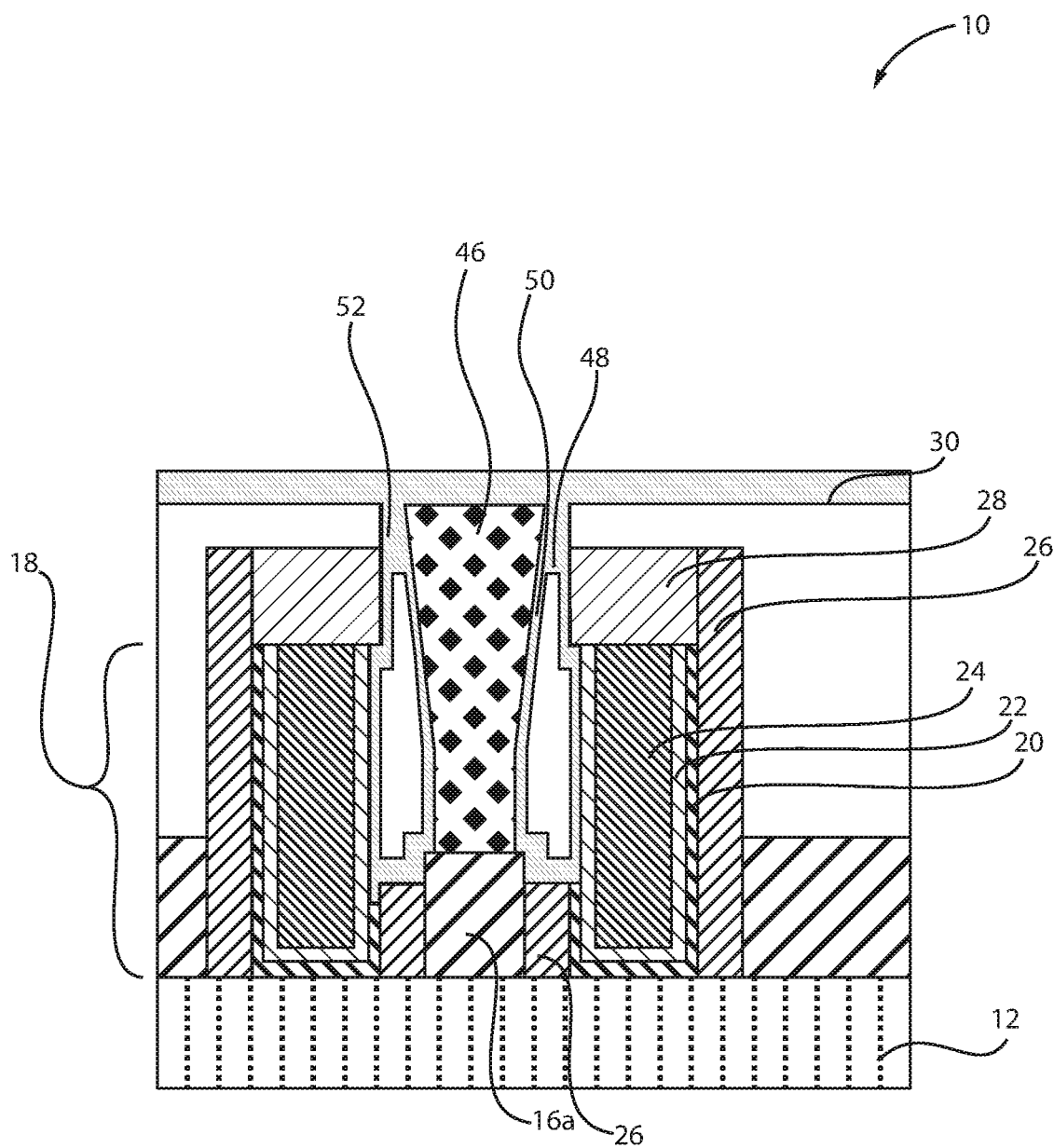
FIG. 10B depicts a side cross-sectional view in the space between adjacent fin structures (similar to cross-section along section line B-B in FIG. 1) at the stage of fabrication of FIG. 7A, in accordance with one embodiment of the present disclosure.

Referring to FIGS. 10A and 10B, shown is the device at a stage of fabrication in which a dielectric spacer material 50 is deposited into trenches 38. The dielectric spacer material 50, which may also be referred to as a third spacer material, conforms to the surfaces of the metal contact 46 and the replacement metal gate structures 18, and forms a layer 50 over the top of the device 10. In the narrower portions of the trenches near the top of the device, air gap pinch off regions 52 are formed by the dielectric spacer material 50. The air gap pinch off regions 52 form a seal in the trench 38 between the metallization layer 26, the nitride cap 28, and/or the interlayer dielectric material 30. The dielectric spacer material 50 is deposited in conformance with these components. In the narrow spaces at the top of the device, the dielectric spacer material 50 "pinches off" the open space below then pinch off region 52, forming an air gap 48 between the replacement metal gate 18 and the metallization layer 46, with the pinch off region 52 of the dielectric spacer material sealing the air gap 48 to the exterior of the device 10.

In one embodiment, the air gap pinch off spacer material 50 may be applied to the device by chemical vapor deposition (CVD). Variations of CVD processes suitable for depositing airgap pinch off spacer material 50 include, but are not limited to atmospheric pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof.

The air gap pinch off spacer material 50 substantially uniformly coats the structure of the device 10. In the regions where the second spacer material 44 has been removed, pinch-off regions form near the top of the device 10, leaving an air gap 48 between the walls of the replacement metal gate 18 and the metal contact 46. Air gap 48 extends in the space between the replacement metal gate 18 and the metal contact 46.

In one embodiment, the air gap pinch off spacer material 50 is a low-k dielectric material that may contribute to the reduction in parasitic capacitance of the device. The low-k dielectric material may have a dielectric constant that is less than about 4.0, e.g., about 3.9. In one embodiment, the low-k dielectric material has a dielectric constant ranging from about 1.75 to about 3.5. In another embodiment, the low-k dielectric material has a dielectric constant ranging from about 2.0 to about 3.2. In yet an even further embodiment, the low-k dielectric material has a dielectric constant ranging from about 2.25 to about 3.0. Examples of materials suitable for the low-k dielectric material include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

Referring to FIG. 12, the air gap pinch off spacer material 50 on the top of the device has been removed, for example, by chemical mechanical polishing (CMP), in one or more polishing steps, employing one or more appropriate slurry compositions. In one embodiment, CMP may be followed by a wet etch process.

Figure 11A:
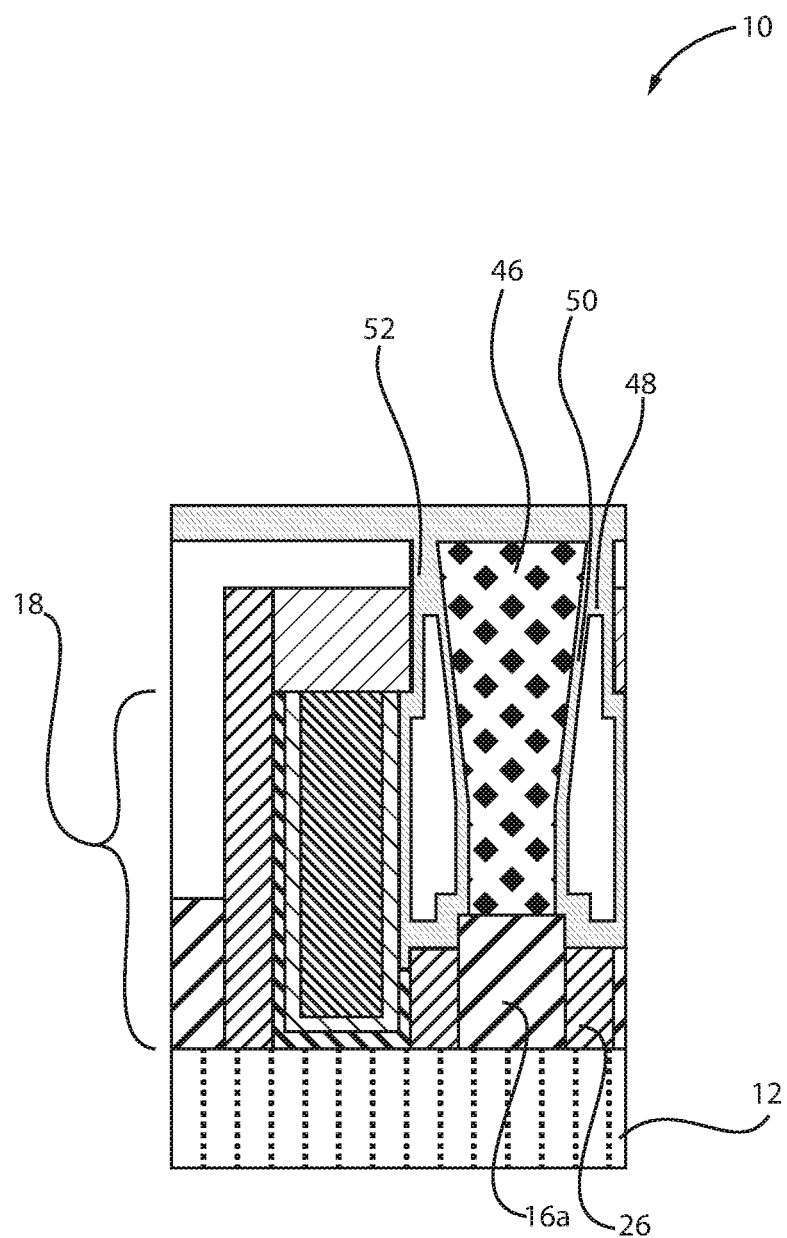
FIG. 11A depicts a side cross-sectional view through the length of a fin structure of the device (similar to the cross-section along section line A-A in FIG. 1) at a stage of fabrication in which chemical mechanical polishing is performed to remove excess third spacer material from the top of the device, in accordance with one embodiment of the present disclosure.
Figure 11B:
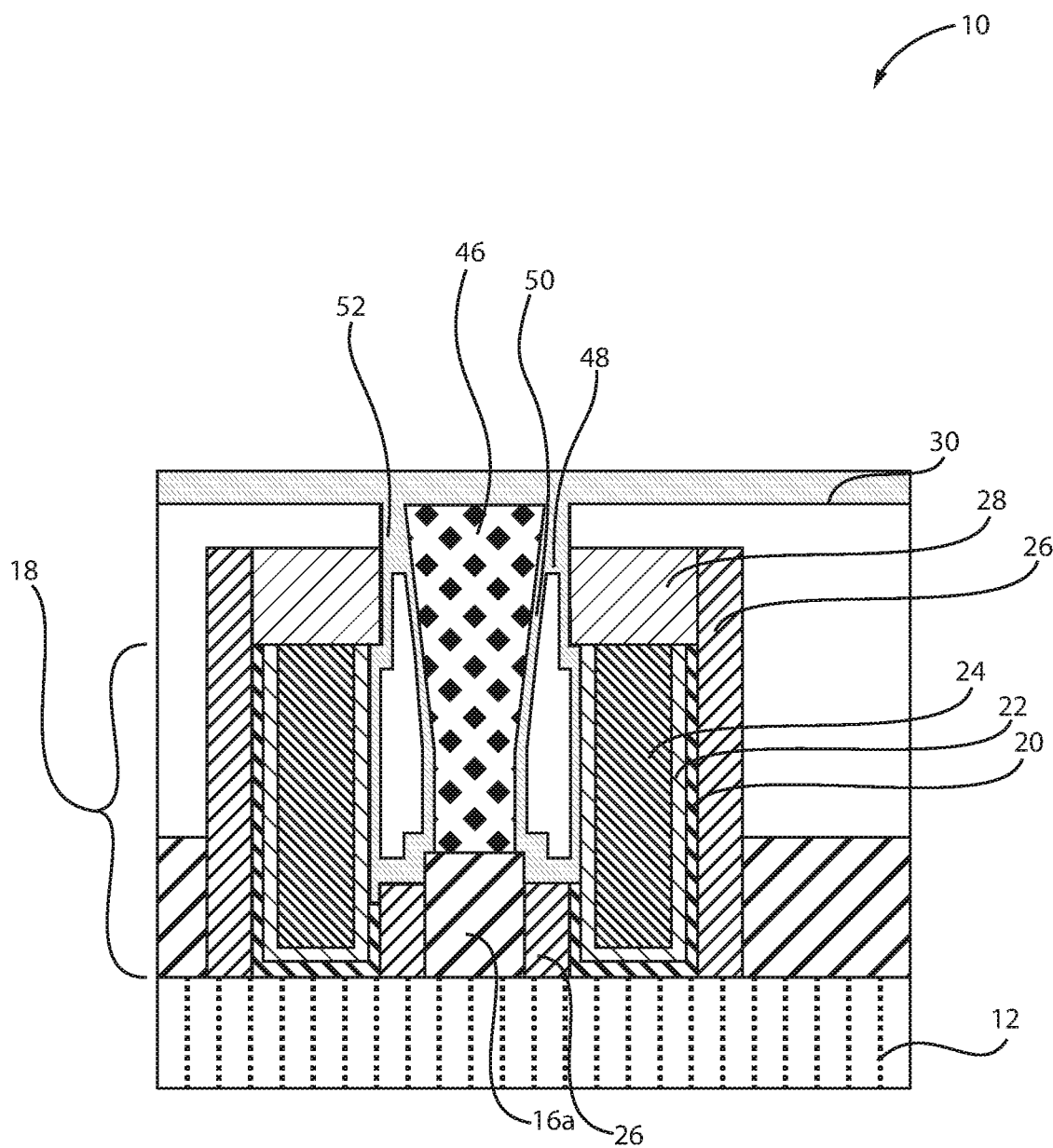
FIG. 11B depicts a side cross-sectional view in the space between adjacent fin structures (similar to cross-section along section line B-B in FIG. 1) at the stage of fabrication of FIG. 11A, in accordance with one embodiment of the present disclosure.

FIGS. 11A and 11B shows a view of the device 10 in which the air gap pinch off spacer material 50 on the top of the device 10 is removed, for example, by chemical mechanical polishing (CMP), in one or more polishing steps, employing one or more appropriate slurry compositions. At this stage of fabrication a device 10 having a high insulating air gap 48 positioned between the replacement gate structures and the metallization layers is provided.

Referring to FIGS. 11A and 11B, the recess 42 does not approach the interface region between the fin structure 14 and work function metal 22 that extends over the fin. In this region, the gate dielectric 20 was not removed in the fabrication of the device, e.g., at the step described above in relation to FIG. 5, where some gate dielectric material 20, e.g., high-k dielectric material, was removed from the replacement metal gate structures 18. The gate dielectric material 20, e.g., high-k dielectric material, separates fin structures 14 from the work function metal 22 so as to maintain the device performance and operability. Further, the recess 42 does not reach the top of the fin structure 14 and is isolated from the air gap 48 by the air gap spacer pinch off material 50. The air gap spacer material 50 keeps contaminating materials out of the recess 42 and gate dielectric material 20, e.g., high-k dielectric material.

In accordance with embodiments of the present principles, the air gaps 48 formed in the pinch off region 52 provide an effective insulating properties that eliminate parasitic capacitance. The dielectric constant of air is near unity, as compared to the dielectric constant of SiN, which is about 7-7.5. The resulting spacer formed by the air gap 48 affords enhanced electrical performance by reducing parasitic capacitance between the replacement metal gates 18 and the metallization 46 formed over the source/drain regions 16.

The structure of the FinFET devices provided with air gaps in pinch off regions formed by dielectric material in accordance with the embodiments of the present principles offer several advantages and improvements. As indicated, parasitic capacitance is reduced, as a result of providing an air gap having a low dielectric constant in place of a traditional spacer, e.g., the spacer 26 that was initially in place around the replacement metal gate structures 18;

Removing a portion of the high-k dielectric material from the sides of the replacement metal gates increases the distance between the metallization layers over the source/drain regions and the gates, which further reduces parasitic capacitance when compared to an air gap of equivalent size to spacer 26.

High-k dielectric materials reduce leakage current significantly (e.g., by 100×). High-k gate dielectric materials can have a greater thickness than, for example, $SiO_2$. Use of metal gates with appropriate work functions can provide the proper threshold voltages ($V_t$) and significantly reduce channel mobility degradation. With the combination of high-k gate dielectrics and metal gates, the transistor performance can be significantly improved, and scaling below ~50 nm becomes possible; and Using the sacrificial spacer material may enable additional control over the metallization layers that are formed, by providing additional space when Hi-K materials are removed from the boundaries of the source/drain contact region.

Throughout this disclosure, different kinds of materials employed in semiconductor fabrication are mentioned. However, these materials are illustrative and other materials are also contemplated and within the scope of the invention. In addition, dimensions of thicknesses are described throughout this disclosure. These thickness dimensions are illustrative and other dimensions may be employed in accordance with the present principles.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described preferred embodiments for a method and structure for forming air gap spacing between metal gates and metallization layers (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming an air gap in a semiconductor structure comprising:

forming a sacrificial spacer that abuts a first structure, wherein the sacrificial spacer is formed in a trench;

forming a second structure that abuts the sacrificial spacer;

removing the sacrificial spacer to form an opening between the first structure and the second structure; and forming a first conformal dielectric layer on opposing sidewalls of the second structure and the first structure, wherein the first conformal dielectric layer defines a perimeter of an air gap disposed in the opening, wherein forming the sacrificial spacer in the trench comprises:

forming an interlayer dielectric layer around the first structure;

etching the interlayer dielectric layer to expose a sidewall spacer that abuts the first structure;

recessing the sidewall spacer to form the trench, defining a depth of the trench;

depositing a second conformal dielectric layer on the interlayer dielectric layer and an exposed sidewall of the first structure; and removing, by use of an anisotropic pull-down etch process, a portion of the second conformal dielectric layer to provide the sacrificial spacer having a width that is greater at its base than at its top.

2. The method of claim 1, wherein the first structure is a first electrically conductive structure.

3. The method of claim 2, wherein the first electrically conductive structure is a gate structure.

4. The method of claim 1, wherein the second structure is a second electrically conductive structure.

5. The method of claim 4, wherein the second electrically conductive structure is a contact to a source/drain region.

6. The method of claim 1, wherein forming the trench exposes a portion of a gate dielectric and the method further comprises etching the exposed portion of the gate dielectric.

7. The method of claim 1, wherein said removing the sacrificial spacer comprises thermally decomposing a solid material of the sacrificial spacer into a gas.

8. The method of claim 7, wherein the composition of the solid material of the sacrificial spacer is selected from the group consisting of polystyrenes, polymethyl methacrylates, polynorbornenes, polypropylene glycols, and combinations thereof.

9. A method for forming an air gap in an electrical device comprising:

forming a first electrically conductive structure;

forming a sacrificial structure abutting the first electrically conductive structure, the sacrificial structure having a base width greater than an upper surface width, wherein the sacrificial structure is formed in a trench;

forming a second electrically conductive structure abutting the sacrificial structure;

removing the sacrificial structure; and forming a first conformal dielectric material layer on opposing sidewalls of an opening provided by said removing the sacrificial structure, the first conformal dielectric material layer merging at an upper portion of the opening, wherein the first conformal dielectric material layer defines a perimeter of an air gap, wherein forming the sacrificial structure in the trench comprises:

forming an interlayer dielectric layer around the first electrically conductive structure;

etching the interlayer dielectric layer to expose a sidewall spacer that abuts the first electrically conductive structure; and recessing the sidewall spacer to define a depth of the trench;

depositing a second conformal dielectric layer on the interlayer dielectric layer and an exposed sidewall of the first electrically conductive structure; and using an anisotropic pull-down etch process to form a sacrificial spacer having a width that is greater at its base than at its top.

10. The method of claim 9, wherein the first electrically conductive structure is a gate structure.

11. The method of claim 9, wherein the second electrically conductive structure is a contact to a source/drain region.

12. The method of claim 9, wherein said removing the sacrificial structure comprises thermally decomposing a solid material of the sacrificial structure into a gas.

13. The method of claim 12, wherein the composition of the solid material of the sacrificial structure is selected from the group consisting of polystyrenes, polymethyl methacrylates, polynorbornenes, polypropylene glycols, and combinations thereof.

14. The method of claim 9, wherein forming the trench exposes a portion of a gate dielectric and the method further comprises etching the exposed portion of the gate dielectric.

15. The method of claim 1, wherein the first conformal dielectric layer has a dielectric constant that is less than about 4.0.

16. A method for forming an air gap in a semiconductor structure comprising:

forming a sacrificial spacer that abuts a first structure, wherein the sacrificial spacer is formed in a trench;

forming a second structure that abuts the sacrificial spacer;

removing the sacrificial spacer to form an opening between the first structure and the second structure; and forming a first conformal dielectric layer on opposing sidewalls of the second structure and the first structure, wherein the first conformal dielectric layer at least partially defines an air gap disposed in the opening with a pinched-off region, wherein forming the sacrificial spacer in the trench comprises:

forming an interlayer dielectric layer around the first structure;

etching the interlayer dielectric layer to expose a sidewall spacer that abuts the first structure;

recessing the sidewall spacer to form the trench, defining a depth of the trench;

depositing a second conformal dielectric layer on the interlayer dielectric layer and an exposed sidewall of the first structure; and removing, by use of an anisotropic pull-down etch process, a portion of the second conformal dielectric layer to provide the sacrificial spacer having a width that is greater at its base than at its top.

17. The method of claim 16, wherein portions of the first conformal dielectric layer contact one another at an entrance of the opening to form the pinched-off region.

* * * * *